United States Patent
Bansal et al.

(10) Patent No.: US 8,606,556 B2
(45) Date of Patent: Dec. 10, 2013

(54) CIRCUIT-LEVEL VALIDATION OF COMPUTER EXECUTABLE DEVICE/CIRCUIT SIMULATORS

(75) Inventors: Aditya Bansal, White Plains, NY (US); Pamela Castalino, Hopewell Junction, NY (US); Dallas M. Lea, Poughkeepsie, NY (US); Amith Singhee, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 1005 days.

(21) Appl. No.: 12/685,108

(22) Filed: Jan. 11, 2010

(65) Prior Publication Data

US 2011/0172979 A1    Jul. 14, 2011

(51) Int. Cl.
*G06F 17/50* (2006.01)
*G06G 7/62* (2006.01)

(52) U.S. Cl.
CPC .................................. *G06F 17/5022* (2013.01)
USPC ............................................... 703/13; 703/21

(58) Field of Classification Search
USPC .................................... 703/4, 13, 21; 716/136
See application file for complete search history.

(56) References Cited

U.S. PATENT DOCUMENTS

| | | | |
|---|---|---|---|
| 6,978,229 B1 | 12/2005 | Saxena | 703/4 |
| 7,047,505 B2 | 5/2006 | Saxena | 716/2 |
| 7,343,215 B2 | 3/2008 | Yun | 700/117 |
| 7,810,053 B2* | 10/2010 | Bushnell et al. | 716/108 |
| 7,895,480 B2* | 2/2011 | Maucksch | 714/704 |
| 2005/0015675 A1* | 1/2005 | Kolawa et al. | 714/38 |
| 2005/0043908 A1 | 2/2005 | Bhavnagarwala | 702/64 |
| 2006/0129367 A1* | 6/2006 | Mishra et al. | 703/13 |
| 2008/0141189 A1 | 6/2008 | Wason | 716/4 |
| 2011/0040548 A1* | 2/2011 | Khalily et al. | 703/14 |

FOREIGN PATENT DOCUMENTS

WO    WO/2007/005724    1/2007

OTHER PUBLICATIONS

Chakravarti, et al. Handbook of Methods of Applied Statistics, vol. I, John Wiley and Sons, pp. 392-394 (1967).
"A class of methods for solving nonlinear simultaneous equations", Mathematics of Computation, vol. 19, No. 92, pp. 577-593, (1965).

* cited by examiner

*Primary Examiner* — Eunhee Kim
(74) *Attorney, Agent, or Firm* — George Sai-Halasz; Preston J. Young

(57) ABSTRACT

A method is disclosed for evaluating a model, characterized as being a computer executable device and circuit simulator. The method includes accepting measured parameters of devices, which devices are essentially identical with, or are actually from, a simulated circuit instance. The model is executed with adjusted input parameters to generate simulated values for properties of the circuit instance. These simulated values are compared with measured values of the same properties. The goodness of the model is determined based on the degree of direct, or statistical, agreement between the simulated and measured values.

17 Claims, 3 Drawing Sheets

CIRCUIT-LEVEL VALIDATION OF COMPUTER EXECUTABLE DEVICE/CIRCUIT SIMULATORS

BACKGROUND

The present invention relates to integrated circuit (IC) design. In particular, it relates computer executable models for simulating devices and circuits.

As microelectronics arts progress toward ever smaller and complicated devices, the reliability of simulator models become questionable. There is a need for evaluating the quality of circuit/circuit simulator models.

BRIEF SUMMARY

A method for evaluating a model characterized as being a computer executable device and circuit simulator is disclosed. The method includes accepting at least one measured device parameter pertaining to at least one device, which device is included a circuit instance. Next, the method includes adjusting at least one input parameter of the model based on the measured device parameter. The model is then executed using the adjusted input parameter to generate at least one simulated value for at least one of the properties of the circuit instance. One may then compare the simulated value with a respective measured value of the circuit instance property. The steps of the method can be repeated for a plurality of circuit instances, and set a pass standard for evaluating the quality of the modeling.

A further method for evaluating a model, characterized as being a computer executable device and circuit simulator, is also disclosed, which is based on statistical comparison of measured and simulated values. The method accepts at least one measured device parameter pertaining to at least one device, which is essentially identical to a transistor in a circuit instant. The measured device and the circuit instance are on the same die. Next, the method includes adjusting at least one input parameter of the model based on the measured device parameter and then executing the model using the adjusted input parameter to generate at least one simulated value for at least one of the properties of the circuit instance. The steps are repeated to generate a set of the simulated values for a plurality of circuit instances, possibly on various dies. One also accumulates a set of measured values for the at least one property of the plurality of circuit instances and compares the set of the simulated values with the set of measured values using statistical techniques.

BRIEF DESCRIPTION OF THE SEVERAL VIEWS OF THE DRAWINGS

These and other features of embodiments of the invention will become apparent from the accompanying detailed description and drawings, wherein.

DETAILED DESCRIPTION

Figure 1:
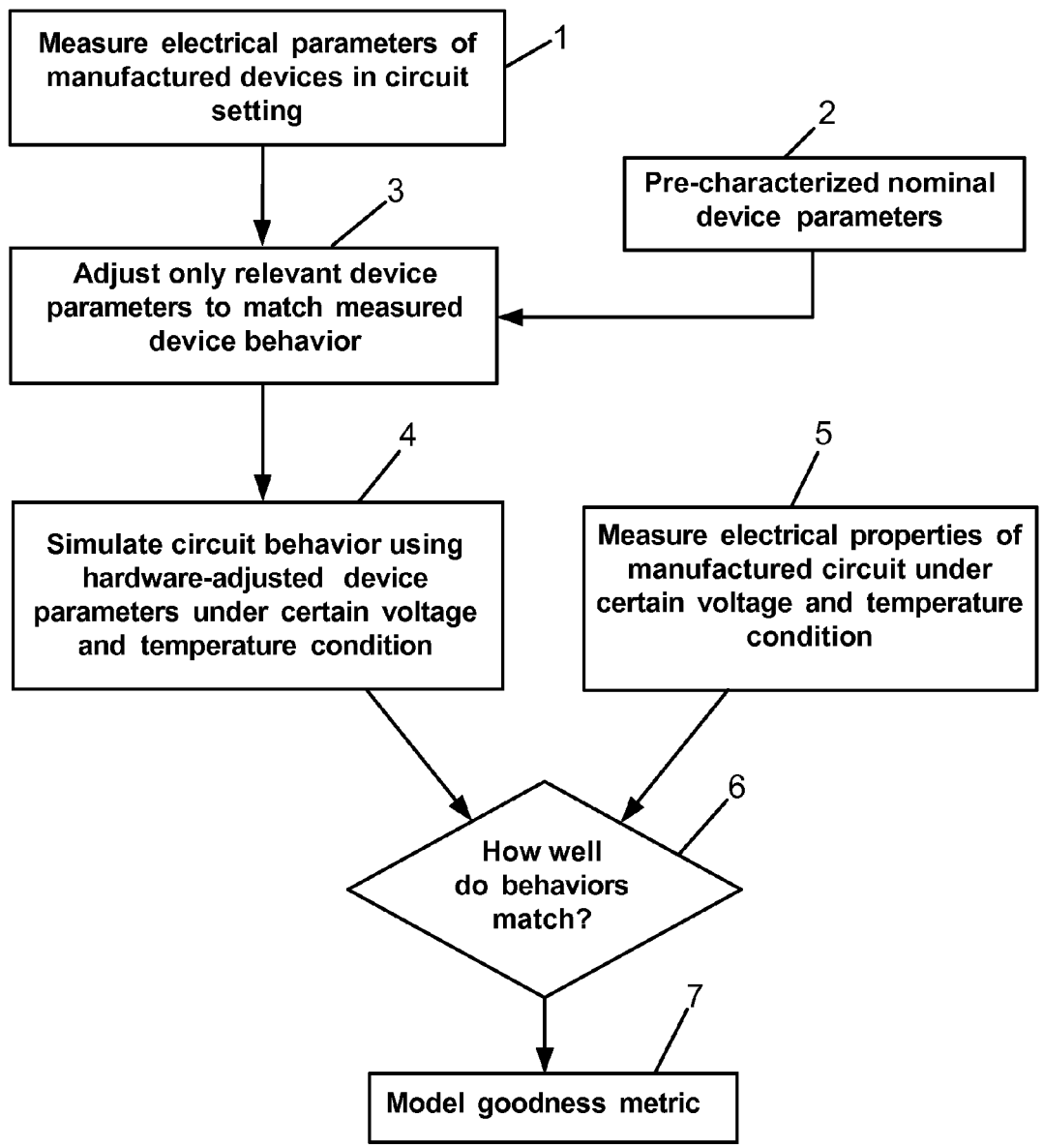
FIG. 1 shows a flowchart of a generalized view of model tuning and validation.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "logic," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the description of the computer executable method and/or the flowcharts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Design of VLSI circuit rely on simulations. The simulations attempt to capture the reality of hardware with a model. The model that is of concern for embodiments of the present disclosure may be characterized as being a computer executable device and circuit simulator, or device/circuit simulator, for brevity. The reality of hardware in this case are devices, or transistors, and circuits. The circuits contain a plurality of transistors/devices connected to one another in various manners. (The terms device and transistor would be used interchangeably throughout the present disclosure.)

The most widely modeled devices are FET-s (Field-Effect-Transistor). There are two type of FET devices: a hole conduction type, called PFET, and an electron conduction type, called NFET. (In different nomenclature the NFET and PFET devices are often referred to as NMOS and PMOS devices.) Often, but not exclusively, PFET and NFET devices are combined into CMOS circuits. However, models are not limited to FET transistors, they may deal with bipolar devices, modulation doped devices (MODFET), Fin type devices, or any other electronic device, and with their circuits. Although in the present disclosure typically FETs will be discussed, such presentation should not be construed as limiting.

A device/circuit model used for VLSI design may have to satisfy conflicting requirements. On the one hand, it should able to provide reliable values for circuit properties even for relatively complex circuits that may contain thousands of devices. On the other hand, it has to execute in a time frame that fits into schedules, iterations, engineering changes, and other time sensitive activities of a design process. This means that the model should strive simultaneously for accuracy and simplicity. As the art of microelectronics progresses, these contradictory goals may be ever more difficult to satisfy. The hardware, with FET device features approaching nanometer scales, is getting more complex and more resistant to be captured by simple models. The more effects are accounted for in the model, the more complex, and consequently more slow it becomes.

A representative example of device/circuit simulators is a SPICE (Simulation Program with Integrated Circuit Emphasis) model. SPICE, or SPICE-type, or SPICE-level, models are widely used across the semiconductor industry. Such models contain mathematical equations for representing devices, device interactions, interconnections, and further physical effects. Such a mathematical description of devices and circuits may be partly empirical, partly physics based. A typical example of the mathematical framework in a SPICE simulator may be BSIM, the well known Berkeley Short-Channel IGFET Model, the latest version of which is BSIM4. But there are several other device/circuit mathematical descriptors, some of which are, for instance, HiSIM (Hiroshima-University IGFET Model), SPICE3 (UC Berkeley), Spectre (Cadence Design Systems), HSPICE (Synopsys), Penn State Philips (PSP available from Philips). Typically the models also use up to several hundred fitting parameters for reproducing device behavior. These parameter values usually are determined by fitting the model to extensive measurements of electrical properties from manufactured test devices.

Embodiments of the present disclosure are not limited by any one particular circuit/device simulator. Although references may be made to SPICE and BSIM, embodiments of the present invention may apply to any model which is a simulator of devices and circuits and combines a mathematical framework with a plurality of input parameters. Such models are typically executed numerically on computers.

Much effort is being spent to achieve good matching between simulated electrical behavior and measured electrical behavior for any single transistor. The parameter fitting to match device behavior involves making several measurements of electrical properties of several manufactured test devices across several design and usage conditions (varying voltage, temperature etc.), and running optimization or fitting algorithms on the device model to obtain a set of parameters with which the model closely matches these measured electrical properties.

In state of the art circuits, which for FET devices may mean gate lengths shorter than 70 nm, successful fitting of individual test devices does not necessarily assure that circuit properties will be satisfactorily simulated, as well. For instance, would a six transistor SRAM (static random access memory) cell behavior, including process and temperature variations, be successfully simulated using a parameter set derived from individual test transistors?

The embodiments of the present invention teach methods to systematically validate any particular device and circuit simulator model's ability to reproduce measured circuit properties against a chosen standard of satisfaction. Furthermore, embodiments of the present invention, in addition to circuit level quality evaluation, also teach the improvement of circuit models by tuning the device the models. The parameter fitting for devices may be derived from hardware device measurements of those devices that are in the circuits themselves, or as closely resembling them as possible. The validation, or evaluation output of the embodiments may be a model goodness metric, possibly given as a percentage, or as a fail/pass decision.

FIG. 1 shows a flowchart of a generalized view of model tuning and validation as taught by embodiments of the present disclosure. One obtains parameters of manufactured devices that are in a circuit setting 1. The circuit setting means that the devices are either part of the actual circuit, or are manufactured to be identical with particular devices in the circuit. Examples of the electrical parameters of interest, without limitation, may be $V_{tlin}$, (low voltage threshold), $V_{tsat}$ (saturation threshold), $I_{dsat}$ (saturation drain current), $I_{off}$ (device off current), and others, known to those skilled in the art. At the same time, the model already possesses input parameters based on pre-characterized nominal devices 2. As stated earlier, the number of such model input parameters may be in the hundreds. Typically such nominal devices are manufactured for the technology in which the circuits are fabricated. In the past, when devices were of larger dimensions and their behavior was less variable, such a set of input parameters based on nominal devices was adequate for circuit simulations. Using the measurement of devices in circuit setting 1 one adjusts 3 a few relevant device input parameters of the model to match the measured values. The number of adjusted input parameters may be similar to the number of measured device parameters. For instance, for BSIM the adjusted input parameters may include those known by the names of vth0, eta0, u0. Next, using the hardware-adjusted device input parameters one simulates circuit properties of that circuit 4 which includes the measured devices, or has transistors closely resembling the measured devices, obtaining simulated values for the circuit properties. Such a circuit, for instance, may be an SRAM cell, and the properties of interest may be read and write times. For the same circuit properties one may also obtain measured values 5. Both the simulation and the measurements may be carried out under a variety of voltage and temperature condition. How well do the simulated and measured values match up can now be compared 6. A model goodness metric can be selected 7, based on various criteria, such as, for instance, the criticality of the circuit, circuit size, anticipated use of the circuit, and others.

The generalized method depicted in the flowchart of FIG. 1 may be applied to evaluate a model directly, or statistically.

Figure 2:
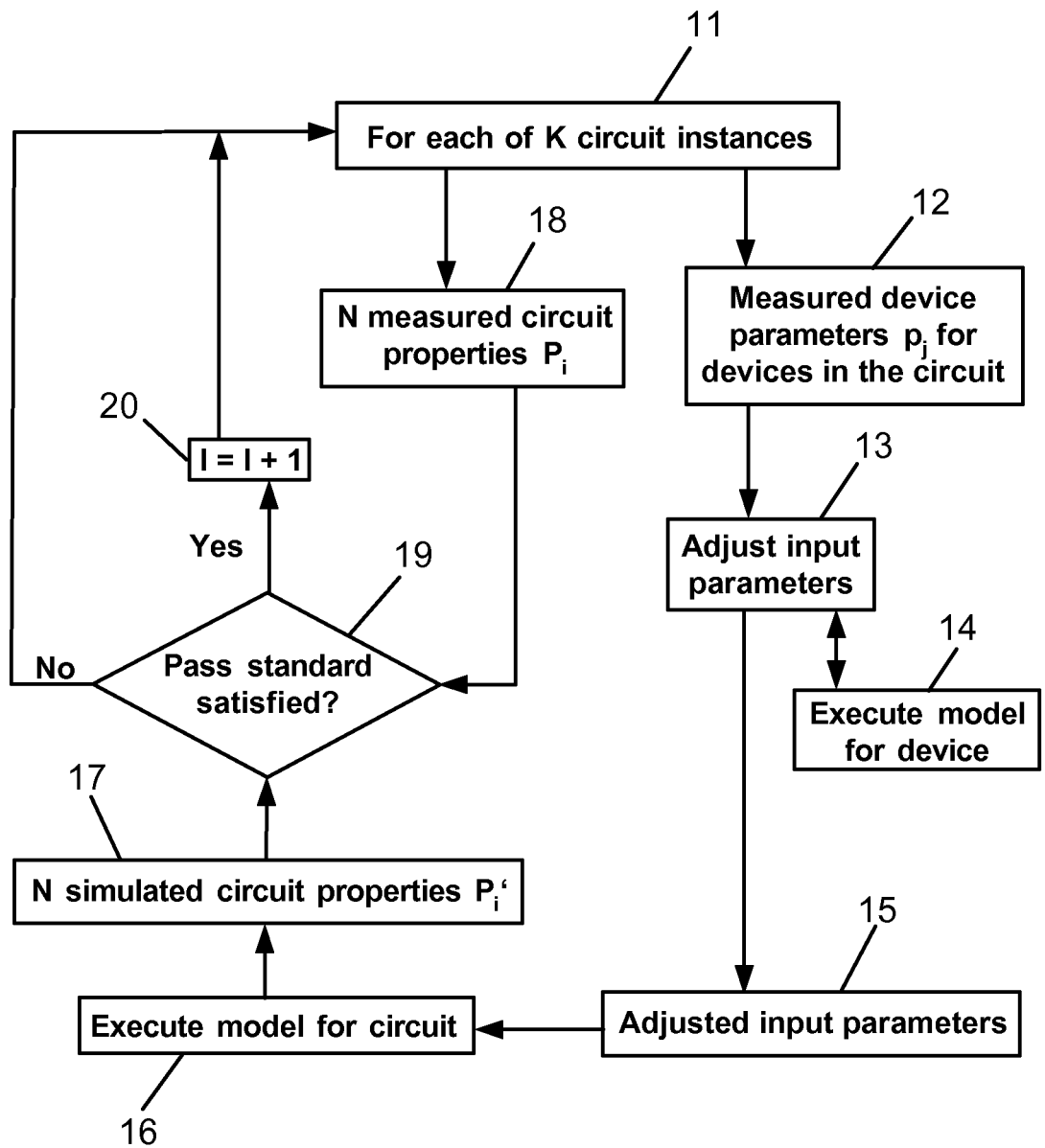
FIG. 2 shows a flowchart for direct device/circuit model validation.

FIG. 2 shows a flowchart for direct device/circuit model validation. In such direct evaluation embodiments of the invention, the comparison between measured and simulated properties of circuit instances are done on the same circuit instance which contains the devices whose parameters are measured and adjusted.

One may commence by selecting K circuit instances 11. A representative value for K maybe ten, but K is at least one, and it may be of a plurality in the hundreds. A circuit instance is a specific circuit on a die, which die typically may be a silicon VLSI chip. Thus, for example, a circuit instance may be selected to be a specific SRAM cell, or a specific multiplexer, or a specific comparator, or any other on the die. However, the very same physical circuit, lets say one specific SRAM cell, may count as more than one circuit instant if conditions change. Thus, for instance, an SRAM cell measured and simulated at room temperature and at 120° C., would be considered as two differing circuit instances. Similarly, if voltage bias conditions were significantly altered, say by over 10%, that too may give rise to differing circuit instances, albeit one deals with the same physical circuit.

For each of the K selected circuit instances 11, suppose for the L-th one, with L=1, . . . K, N circuit properties $P_i$ are being measured 18, meaning i=1, . . . N. The presented method for circuit validation then accepts these measured values of circuit properties. The number N of circuit properties measured for each circuit instance is at least 1, but it also maybe more. As mentioned above, for an SRAM cell, for instance, such properties may be switching voltage, write time, etc. The relevant properties of common circuit instances are know to those skilled in the art. All K circuit instances may have the same N number of properties measured, but in general this is not the case. Each individual L-th circuit instance has its own number N of measured properties.

For each of K circuit instances, for example, for the L-th one, $p_j$ device parameters are measured 12 for exactly those devices that make up L-th circuit instance. Ideally one would prefer to measure the parameters of all the devices that make up the L-th circuit instance, that is one would accept at least one measured device parameter for each device comprised in the L-th circuit instance. But, since that may not be always be practical, one measures parameters for at least one device that is contained in the L-th circuit. The presented method for circuit validation then accepts these measured device parameters. The number of $p_j$ parameters measured for each device is at least one, but more typically it may be a small plurality, usually under ten. Examples of such device parameters were already given earlier, such as without intent of limiting, threshold voltages, or various device currents.

As part of exercising embodiments of the method, one may find that dealing precisely with one or another particular device parameter leads to better simulation results for one or another particular type of circuit. For instance, only to illustrate as an example, it may turn out after experience with embodiments of the invention, that SRAM write times are best simulated when device saturation currents are precisely adjusted, while multiplexer simulations are more dependent on getting thresholds right. Or, possibly such correlations are found in circuits fabricated in one given particular manner, or maybe no such correlations are found.

Having accepted the measured device parameters 12 for the L-th circuit instance, a few relevant device input parameters of the model are adjusted 13 using the measured device parameter values. The adjustment occurs relative to the already available input parameters, which were based on pre-characterized nominal devices. During this adjustment process the model itself is executed for the device in question 14, typically in an iterative fashion. For instance, for BSIM the adjusted input parameters may include vth0, eta0, u0, and others. The input parameter adjustment using the measured device parameters is terminated once the model satisfactorily reproduces the measured device behavior. The number of adjusted input parameters may be similar to the number of measured device parameters, but it is at least one. In some embodiments of the invention the number of measured device parameters equals the number of adjusted model input parameters.

Adjusting some input parameters to reproduce, or match, the measured device parameters, is in itself not an obvious problem. A methodology has to be developed which is independent of the particular model that happens to be validated. Suppose for a given device one accepts "Q" number of $p_j$ measured device parameters, namely j=1, . . . Q, and wants to adjust an equal Q number of model input parameters $d_a$, namely a=1, . . . Q, as well. As one executes the model with a set of input parameters $d_a$, to obtain the set of measured parameters values $p_j$, in effect one sets up Q number of nonlinear equations $f_1 \ldots f_Q$. The relations being $p_j=f_j(d_1, \ldots, d_Q)$. The $f_j$ functions can be evaluated by running the simulations with the given model parameter values. A nonlinear equation solver can be used to solve this system of nonlinear equations for the values $d_1, \ldots, d_Q$) given the measured values of $p_1, \ldots, p_Q$. The mathematics literature is familiar with such nonlinear equation solutions, for instance, see C. G. Broyden, "A class of methods for solving nonlinear simultaneous equations," Mathematics of Computation, vol. 92, pp. 577-593, October 1965, incorporated herein for reference.

The above discussion was presented for the case when the number of measured device parameters equaled the number of adjusted input parameters. If the two numbers do not equal, one has either an over, or an under, determined problem. However, these too can be dealt with known mathematical methods. It was also found that gradient driven stepwise iterations of input parameters may lead to quite satisfactory matching of the measured device parameter values. However, by whatever means are the input parameter values adjusted, by formal mathematical methods, or by other non-formal methods, such an adjustment is within the scope of the embodiments of the present disclosure. In all parameter adjustment scenarios the model is executed to produce a simulated behavior of the device, and that behavior is compared with a measured behavior of the device.

When the input parameter adjustments 13, 14 are completed, one has a full adjusted set of input parameters 15 for the model. With these, the device/circuit simulator model is executed 16 for the L-th circuit instance. The result of the simulation is N number of simulated values $P'_1$ 17 for the circuit instant's properties. As stated earlier, N is at least one. In such a direct comparison embodiment, the same properties are being simulated as being measured, consequently, each simulated property value can be compared with its respective measured counterpart. One may ask then whether for this particular L-th circuit instance the model passed, or failed 19 the chosen standard.

There are many ways that one may set a pass standard for a given circuit instance. For instance, one may sum the absolute values of the differences between measured and simulated values for each property $\Sigma |P_i - P'_i|$, and set a limit for this sum. Or, depending on needs, as discussed above, other pass standards may be applied, for instance, based squaring techniques, namely, related to he sum of the square of the differences. Most pass standard that one may set for a given circuit instance may be thought of as requiring of the typical simulated circuit property to be within 5-10% of its measured value.

One may also give an overall goodness parameter to the model in validation taking into consideration the results of all the K circuit instances. The steps as detailed above for a hypothetical L-th circuit instance, namely the accepting, adjusting, executing, and comparing steps, are repeated for all K plurality of circuit instances. For each of these repetitions there is decision whether the pass standard has been satisfied 19. Each time the pass standard is satisfied one may increase the value of a counter $1=1+1$, 20. An overall goodness value, or validation parameter, may be given to the model, for instance as the ratio 1/K. Namely, the ratio between the count of satisfying the pass standard, 1, and the count of the number of repetitions due to the number of selected circuit instances K. As an example, and without limiting intent, an 1 to K ratio of 0.9 may be an acceptable goodness value for the model.

In order for embodiments of the presented method to accept measured circuit properties and measured device parameters, the circuit instances and the devices in the circuit instances have to be accessible for measurements. In the overall chip, or die, design one may purposefully provide measuring access to a certain representative number of circuit instances. Such techniques are known in the art. Regarding measuring parameters for individual devices in the circuit instances, there too techniques exist to have access even to all devices of a circuit instance. The term Flycell is used by those familiar with the art to refer to a circuit that provides probe access to every device terminal. Such Flycells may be used as the circuit instances on which to validate the model. However, it may happen that model evaluation is needed, and no prepared access has been provided to the devices. In such cases one may have to sacrifice a certain number of dies, or chips. After the circuit property measurements are done, strip away all layers that cover the contacts to the device terminals and use small, for instance, atomic force probes to contact the device terminals and measure device parameters.

Figure 3:
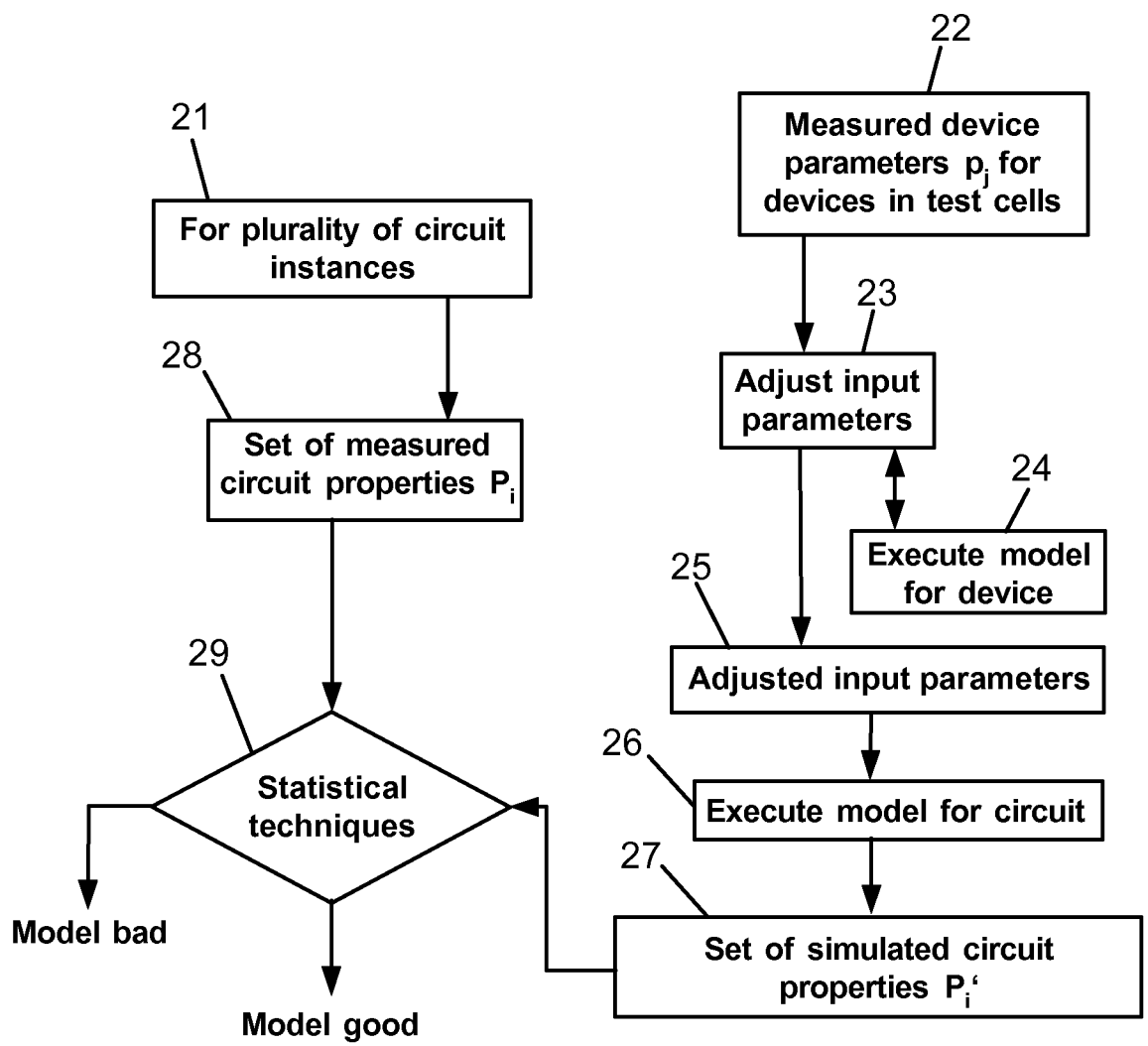
FIG. 3 shows a flowchart for statistical device/circuit model validation.

FIG. 3 shows a flowchart for statistical device/circuit model validation. There are instances when direct device/circuit model validation as presented in relation to FIG. 2 is not possible, or not desirable.

In the statistical device/circuit model validation one again adjusts model input parameters for devices based on measurements, and again compares measured and simulated values for properties of circuit instances, but the measured devices may not be in the measured circuit instances. The device measurements typically are made in some test cells that are designed to allow convenient and accurate electrical measurements on single transistors, while the circuit measurements are made on the circuit instance of interest. However, device measurements may be made on other devices which are outside of test cells, if necessary even by stripping of covering layers. In any case, the measured devices, either in the test cells, or outside of them, are selected based of the fact that they are close to, ideally essentially identical with, the transistors in the circuit instance. The measured devices are preferably drawn to be identical, namely to have the same length and width as the circuit instance transistors. One may also provide for similar capacitive loading to that of the circuit instance. One may also try to replicate resistive and other parasitic effects deemed to be present in the circuit environment. Any measured device which is used to adjust parameters for the modeling of a particular circuit instance, and the particular circuit instant itself, are hosted by the same single hardware die. Of course the model evaluation procedure can be, and usually is, repeated across many dies in order to yield reliable statistics. If a large number of dies are measured it may ensure that the statistical variation seen by the measured devices will be the same as the statistical variation seen by the devices in the measured circuit instances. The circuit instances may be selected to represent only one circuit type, for instance an SRAM, or they may be representatives of several circuit types.

For every measured circuit instance 21, preferably a set of devices, but at least one device is also measured. It is desirable to measure the parameters of every transistor that makes up the circuit instant. Apart of the fact that the measured devices typically do not belong to the measured circuits, the specifics of a statistical embodiment of the invention are quite similar to a direct validation embodiment.

Again, the method accepts at least one measured device parameter $p_j$ pertaining to at least one device, when the device may be part of a test cell 22. Any measured device, and the test cell devices in particular, preferably are essentially designed identical to the transistor in the circuit instance of interest. The measured devices and the circuit instant of interest are hosted by the same die.

Next, one adjusts at least one of the input parameters of the model which pertains to the at least one measured device, by using the at least one measured device parameter 23. The model input parameter adjustments 23, 24 proceed in the same manner as described above in reference to FIG. 2, in steps 13 and 14. The discussion regarding nonlinear equation solutions and formal, or informal, mathematical methods also carries over from the direct evaluation embodiments. One finally obtains at least one, but preferable a plurality, of adjusted input parameters 25.

In the following, one executes the model using the at least one adjusted input parameter 26 to generate a simulated value for at least one property of the circuit instant of interest. Again, the discussion with reference to step 16 in FIG. 2 carries over.

By repeating, possibly across many dies, the accepting, adjusting, and executing steps for a plurality of circuit instances and corresponding measured devices, one generates a set of the simulated values $P'_i$ of the circuit properties 27.

One also accumulates 28 a set of measured values for at least one property $P_i$ of the plurality of circuit instances 21, and then one may compare the set of the simulated values with the set of measured values using statistical techniques 29. A pass standard for the model is based on the degree of statistical equivalence of the simulated and measured values. Such statistical standards may combine the various statistics of each measured/simulated circuit instance property, and then combine with similar statistics from the various selected circuits types, if more than one type was considered.

Such statistical standards may involve comparing medians, averages, various moments of the distributions, and set a certain level for acceptance. As an example, one may require that if a modeling is to receive pass qualification based on statistical measures, the differences in means and the differences in standard deviations to fall within a certain range, for instance within 5% of one another.

Depending on particular needs of the model validation, one may use passing standards tailored for that particular need, or one may use more uniform formal standards. A formal method for comparing statistical distributions known in the art is to compute a two sample Kolmogorov-Smirnov (KS) statistic for each property and each kind of circuit type. Then, use a measure of the KS statistic to discern satisfaction regarding a chosen pass standard for the model.

Various embodiments of the method for evaluating a model are computer executable and may be captured in a computer program product that contains a computer useable medium having a computer readable program code embodied in it. When the computer readable program code is executed on a computer, it causes the computer to execute the steps as taught by the embodiments of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A method, comprising:
accepting at least one measured device parameter pertaining to at least one device, wherein said at least one device is comprised in a circuit instance, wherein said circuit instance is manufactured as part of a sub 70 nm gate-length-technology VLSI chip, wherein said circuit instance has properties, wherein a model is a computer executable device and circuit simulator, and said model comprises input parameters;
adjusting at least one of said input parameters pertaining to said at least one device by using said at least one measured device parameter;
executing by a computer said model using said at least one adjusted input parameter to generate at least one simulated value for at least one of said properties of said circuit instance;
comparing said at least one simulated value with a respective measured value of at least one of said properties of said circuit instance;
repeating said accepting, adjusting, executing, and comparing steps for a plurality of circuit instances; and
using said comparing steps to quantitatively evaluate simulator capabilities of said model.

2. The method of claim 1, further comprising:
in said comparing step, choosing a pass standard for said model, and applying said pass standard for each of said repeating steps.

3. The method of claim 2, further comprising:
defining a validation parameter for said model as a ratio between a count of satisfying said pass standard and a count of said repeating steps.

4. The method of claim 1, further comprising:
accepting at least one measured device parameter for each device comprised in said circuit instance.

5. The method of claim 1, further comprising:
for said at least one device, adjusting a same number of said input parameters as is the number of said measured device parameters.

6. The method of claim 1, further comprising:
in said adjusting step, executing said model to produce a simulated behavior of said at least one device and comparing said simulated behavior with a measured behavior of said at least one device.

7. The method of claim 6, further comprising:
selecting said model to be SPICE.

8. A method comprising:
accepting at least one measured device parameter pertaining to at least one device, wherein said at least one device is identically drawn to a transistor in a circuit instant, wherein said at least one device and said circuit instant are hosted by a sub 70 nm gate-length-technology VLSI chip, wherein said circuit instant has properties, wherein a model is a computer executable device and circuit simulator, and said model comprises input parameters;
adjusting at least one of said input parameters by using said at least one measured device parameter;
executing by a computer said model using said at least one adjusted input parameter to generate a simulated value for at least one property of said circuit instant;

generating a set of said simulated values by repeating said accepting, adjusting, and executing steps for a plurality of circuit instances;

accumulating a set of measured values for said at least one property of said plurality of circuit instances;

comparing said set of said simulated values with said set of measured values using statistical techniques; and in said comparing step applying a pass standard for said model based on a degree of statistical equivalence of said set of said simulated values and said set of measured values.

9. The method of claim 8, further comprising:

computing a two sample Kolmogorov-Smirnov (KS) statistic for each different ones of said at least one property of said plurality of circuit instances, and using a measure of said KS statistic to discern satisfaction of said pass standard.

10. The method of claim 8, wherein said sub 70 nm gate-length-technology VLSI chip further hosts at least one test cell, said method further comprises selecting said at least one device from said at least one test cell.

11. The method of claim 10, wherein said at least one test cell comprises a plurality of devices, and said plurality of devices correspond to, and are identically drawn with, transistors in said circuit instance, said method further comprises accepting measured device parameters from all of said plurality of devices.

12. The method of claim 8, further comprising:

for said at least one device, adjusting a same number of said input parameters as is the number of said measured device parameters.

13. The method of claim 8, further comprising:

in said adjusting step, executing said model to produce a simulated behavior of said at least one device and comparing said simulated behavior with a measured behavior of said at least one device.

14. The method of claim 8, further comprising:

selecting said plurality of circuit instances in a manner to represent a plurality of VLSI chips.

15. The method of claim 8, further comprising:

selecting said model to be SPICE.

16. A computer program product comprising a non-transitory computer readable storage medium having a computer readable program code embodied therewith, wherein said computer readable program code when executed on a computer causes said computer to:

accept at least one measured device parameter pertaining to at least one device, wherein said at least one device is comprised in a circuit instance, wherein said circuit instance is manufactured as part of a sub 70 nm gate-length-technology VLSI chip, wherein said circuit instance has properties, wherein a model characterized as being a computer executable device and circuit simulator comprises input parameters;

adjust at least one of said input parameters pertaining to said at least one device by using said at least one measured device parameter;

execute said model using said at least one adjusted input parameter to generate at least one simulated value for at least one of said properties of said circuit instance;

compare said at least one simulated value with a received respective measured value of at least one of said properties of said circuit instance;

repeat said accept, adjust, execute, and compare steps for a plurality of circuit instances, and in said compare steps quantitatively evaluate simulator capabilities of said model.

17. A computer program product comprising a non-transitory computer readable storage medium having a computer readable program code embodied therewith, wherein said computer readable program code when executed on a computer causes said computer to:

accept at least one measured device parameter pertaining to at least one device, wherein said at least one device is identically drawn to a transistor in a circuit instant, wherein said at least one device and said circuit instant are hosted by a sub 70 nm gate-length-technology VLSI chip, wherein said circuit instant has properties, wherein a model comprises input parameters, and wherein said model is characterized as being a computer executable device and circuit simulator;

adjust at least one of said input parameters by using said at least one measured device parameter;

execute said model using said at least one adjusted input parameter to generate a simulated value for at least one property of said circuit instant;

generate a set of said simulated values by repeating said accepting, adjusting, and executing steps for a plurality of circuit instances;

accumulate a set of measured values for said at least one property of said plurality of circuit instances;

compare said set of said simulated values with said set of measured values using statistical techniques; and in said compare step, apply a pass standard for said model based on a degree of statistical equivalence of said set of said simulated values and said set of measured values.

* * * * *